(12) United States Patent
Mehta et al.

(10) Patent No.: US 6,222,404 B1
(45) Date of Patent: Apr. 24, 2001

(54) EDGE-TRIGGERED DUAL-RAIL DYNAMIC FLIP-FLOP WITH AN ENHANCED SELF-SHUT-OFF MECHANISM

(75) Inventors: Anup S. Mehta, Santa Clara; Chaim Amir, Sunnyvale; Edgardo F. Klass, Palo Alto; Ashutosh K. Das, Sunnyvale, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/340,745

(22) Filed: Jun. 28, 1999

(51) Int. Cl.$^7$ ..................................................... H03K 3/037

(52) U.S. Cl. ........................... 327/200; 327/198; 327/212

(58) Field of Search ..................................... 327/200, 201, 327/199, 208–212, 198

(56) References Cited

U.S. PATENT DOCUMENTS 5,384,493 * 1/1995 Furuki .................................... 327/212
6,064,245 * 5/2000 Singh et al. .......................... 327/200

* cited by examiner

Primary Examiner—Toan Tran
(74) Attorney, Agent, or Firm—Forrest Gunnison; Gunnison, McKay & Hodgson LLP

(57) ABSTRACT

A shut-off circuit included in a dynamic flip-flop isolates output terminals of the dynamic flip-flop from circuitry within the flip-flop that could introduce noise on either output terminal during a portion of the evaluation phase. Since the output terminals are isolated from the input terminals during this portion of the evaluation phase, spurious input signals have no affect on the output signal levels. Similarly, charge within the dynamic flip-flop that is not completely dissipated in the transition from a precharge phase to the evaluation phase has no affect on the output signal levels during this portion of the evaluation phase.

17 Claims, 6 Drawing Sheets

EDGE-TRIGGERED DUAL-RAIL DYNAMIC FLIP-FLOP WITH AN ENHANCED SELF-SHUT-OFF MECHANISM

BACKGROUND OF THE INVENTION

1. Field of the Invention

This invention relates generally to circuit storage elements, and more particularly to flip-flops with a dynamic input stage.

2. Description of Related Art

Dynamic flip-flops are widely used in state of the art microprocessors. One particularly advantageous flip-flop that has a dynamic input stage and an output stage is disclosed in commonly owned U.S. Pat. No. 5,825,224, entitled "Edge-Triggered Dual-Rail Dynamic Flip-Flop With Self-Shut-Off Mechanism," issued to Klass et al. on Oct. 20, 1998, which is incorporated herein by reference in its entirety.

While the flip-flop of U.S. Pat. No. 5,825,224 is a significant advance over prior art configurations, there are certain configurations of the flip-flop that may have a charge-sharing problem. In these configurations, the output signal on one of the output terminals of the dynamic input stages momentarily changes during the evaluation phase. The momentary change may result in a state change on an output terminal of the flip-flop, which in turn can lead to erroneous results.

To better understand the limitations of the prior art flip-flop consider FIG. 1A, which is a schematic of a flip-flop 100 according to U.S. Pat. No. 5,825,224. Flip-flop 100 includes a three-input Exclusive OR circuit and a three-input Exclusive NOR circuit that introduce a charge-sharing problem within flip-flop 100.

In FIG. 1, elements with the same reference numeral as the reference number in FIG. 7 of U.S. Pat. No. 5,825,224 (the '224 patent) are the same element. Therefore, the operation of flip-flop 100 will be apparent to those of skill in the art in view of the description in the '224 patent.

Precharge PMOS transistors 101 to 106 are used to precharge nodes within the Exclusive OR and Exclusive NOR circuit. Precharge PMOS transistors 101 to 106 assure that there is no potential difference across the transistors in the combinatorial logic circuits during the precharge phase. Consequently, in the transition to the evaluation phase there is no spike or false evaluation on the output node that does not change state.

Assume that input signals A, B and C are either all a logic zero, or any two of the signals are a logic one at the start of the evaluation phase. Traces for signals A, B and C are presented in FIG. 1B. For all these combinations of input signals, the signal on line OUTN1 remains at a logic one level, while the signal on line OUTN2 is pulled to a logic zero level as the clock signal on clock line CLK goes active. See FIG. 1B.

As explained in the '224 patent, two inverter delays after the signal on line OUTN2 goes inactive, NMOS transistor S1 is turned off. NMOS transistor S2 remains turned-on, while keeper NMOS transistor K1 is turned-off. Consequently, output line OUTN2 is coupled to the Exclusive NOR circuitry through NMOS transistor S2.

If an input signal to the Exclusive NOR circuity changes, e.g., signal A as illustrated in FIG. 1B, the output signal of the Exclusive NOR circuitry may change, which in turn momentarily changes the output signal on output line OUTN2 as illustrated in FIG. 1B. However, pull-down device 4 prevents the signal on output line OUTN2 from going to a logic high level. Therefore, the output signal on output line OUTN2 has at most a momentary glitch 152 that is generated in response to input signal A changing state after the start of the evaluation phase. Momentary glitch 152 may cause a corresponding dip on output terminal/Q.

Flip-flop 100 is used to drive dynamic logic, which typically responds only to a low-to-high transition on a clock edge. Since the downstream dynamic logic driven by the signal on terminal/Q responds to the low-to-high transition on terminal/Q, glitch 152 does not affect the state of the logic. However, in general, in digital logic, glitches are undesirable.

Glitch 152 on line OUTN2 may be of sufficient magnitude to pass through inverters INV2 and INV3, which in turn causes shut-off transistor S1 to momentarily conduct. This can result in a low-to-high transition on output terminal Q, which in turn may result in a false evaluation by dynamic logic driven by the signal on output terminal Q. While glitch 152 alone may not be sufficient to cause inverter INV3 to change state, wire coupling may effectively amplify the glitch so that inverter INV3 does change state. Consequently, the performance of flip-flop 100 is dependent upon layout conditions combined with input state changes during the evaluation phase.

Consequently, utilization of flip-flop 100 requires an analysis to determine whether layout factors coupled with changes in input signals can result in spurious signals on either of the flip-flops' two output lines during the evaluation phase. Therefore, a more robust dynamic flip-flop is needed that has performance that is unaffected by input signal changes and layout considerations.

SUMMARY OF THE INVENTION

According to the principles of this invention, a dynamic flip-flop has complete input signal isolation following the hold time in the evaluation phase. A novel shut-off circuit included in the dynamic flip-flop isolates output terminals of the dynamic flip-flop from circuitry within the flip-flop that could introduce a signal level change on either output terminal during a portion of the evaluation phase following the hold-time.

Since the output terminals are isolated from the input terminals during this portion of the evaluation phase, spurious signals on either input terminal have no affect on the output signal levels. Moreover, the isolation removes concern about cross-coupling between signal lines. Similarly, charge within the dynamic flip-flop that is not completely dissipated in the transition from the precharge phase to the evaluation phase has no affect on the output signal levels during this portion of the evaluation phase.

Hence, unlike the prior art flip-flop described above, the dynamic flip-flop of this invention includes all the advantages of the prior art flip-flop and in addition is more robust with respect to charge-sharing problems. Consequently, the dynamic flip-flop of this invention can be used in a wide variety of configurations without requiring an analysis of each configuration to determine whether charge-sharing may be a problem.

In one embodiment, the dynamic flip-flop of this invention includes a first input latch having at least one input line, a clock line, and an output line. The first input latch generates a signal on the output line of the first input latch having a predefined logic state during the first phase of operation. The first input latch generates a signal on the output line of the first input latch in response to the input signal following initiation of the second phase of operation.

The dynamic flip-flop also includes a second input latch having at least one input line, a clock line, and an output line. The second input latch generates a signal on the output line of the second input latch having the predefined logic state during the first phase of operation. The second input latch generates a signal on the output line of the second input latch in response to the input signal following initiation of the second phase of operation.

A shut-off circuit in the dynamic flip-flop of this invention includes a first input line coupled to the output line of the first input latch; a second input line coupled to the output line of the second input latch; and an output line coupled to the first and second input latches. The shut-off circuit generates a signal on the output line in response to a change of signal level on one of the first and second input lines following initiation of the second phase of operation. The output signal from the shut-off circuit decouples the input line of the first input latch from the output line of the first input latch and also simultaneously decouples the input line of the second input latch from the output line of the second input latch for a remainder of the second phase. Thus, the shut-off circuit terminates sampling of signals on both the at least one input line of the first input latch and the at least one input line of the second input latch. As used herein, sampling means generating an output signal in response to a signal on an input line.

The dynamic flip-flop also includes an output stage having a first output line coupled to the output line of the first input latch, and a second output line coupled to the output line of the second input latch.

In one embodiment, the at least one input line of the first latch is an input line to a combinatorial logic circuit, and the at least one input line of the second input latch is an input line to another combinatorial logic circuit. The combinatorial logic circuit and the another combinatorial logic circuit comprise an Exclusive OR gate circuit and an Exclusive NOR circuit in one application. Of course, other positive and negative logic circuits could be used for the combinatorial logic circuits.

In another embodiment, a dynamic flip-flop having first and second phases of operation includes first and second input latches. The first input latch includes a first combinatorial logic circuit, first and second transistors, and an output line.

The first combinatorial logic circuit includes a plurality of input lines and an output terminal. The first transistor has a first channel type, and includes a first lead connected to the output terminal of the first combinatorial logic circuit; a second lead; and a gate. The second transistor has a second channel type, and includes a first lead connected to the second lead of the first transistor; a second lead connected to a first reference voltage; and a gate connected to a clock terminal. The output line of the first latch is connected to the second lead of the first transistor.

Similarly, a second input latch includes a second combinatorial logic circuit, third and fourth transistors and an output line. The second combinatorial logic circuit includes a plurality of input lines and an output terminal. The third transistor has the first channel type and includes a first lead connected to the output terminal of the second combinatorial logic circuit; a second lead; and a gate. The second transistor has the second channel type, and includes a first lead connected to the second lead of the third transistor, a second lead connected to the first reference voltage, and a gate connected to the clock terminal. The output line of the second latch is connected to the second lead of the third transistor.

This embodiment of the dynamic flip-flop also includes a shut-off circuit having a first input terminal connected to the output line of the first latch; a second input terminal connected to the output line of the second latch; and an output line connected to the gate of the first transistor, and connected to the gate of the third transistor.

The first and second input latches also include a fifth transistor having the first channel type. The fifth transistor includes a first lead connected to another terminal of the first combinatorial logic circuit and to another terminal of the second combinatorial logic circuit; a second lead connected to a second reference voltage, and a gate connected to the clock terminal. As is known, to those of skill in the art, the particular channel type, either P-channel or N-channel, is determined by the biasing scheme used, i.e., the potentials used for the first and second reference voltages.

BRIEF DESCRIPTION OF THE DRAWINGS

In the specification, elements with the same reference number are the same element. In addition, the first digit of a reference number for an element is the number of the Figure in which the element first appears.

DETAILED DESCRIPTION OF THE INVENTION

Figure 1A:
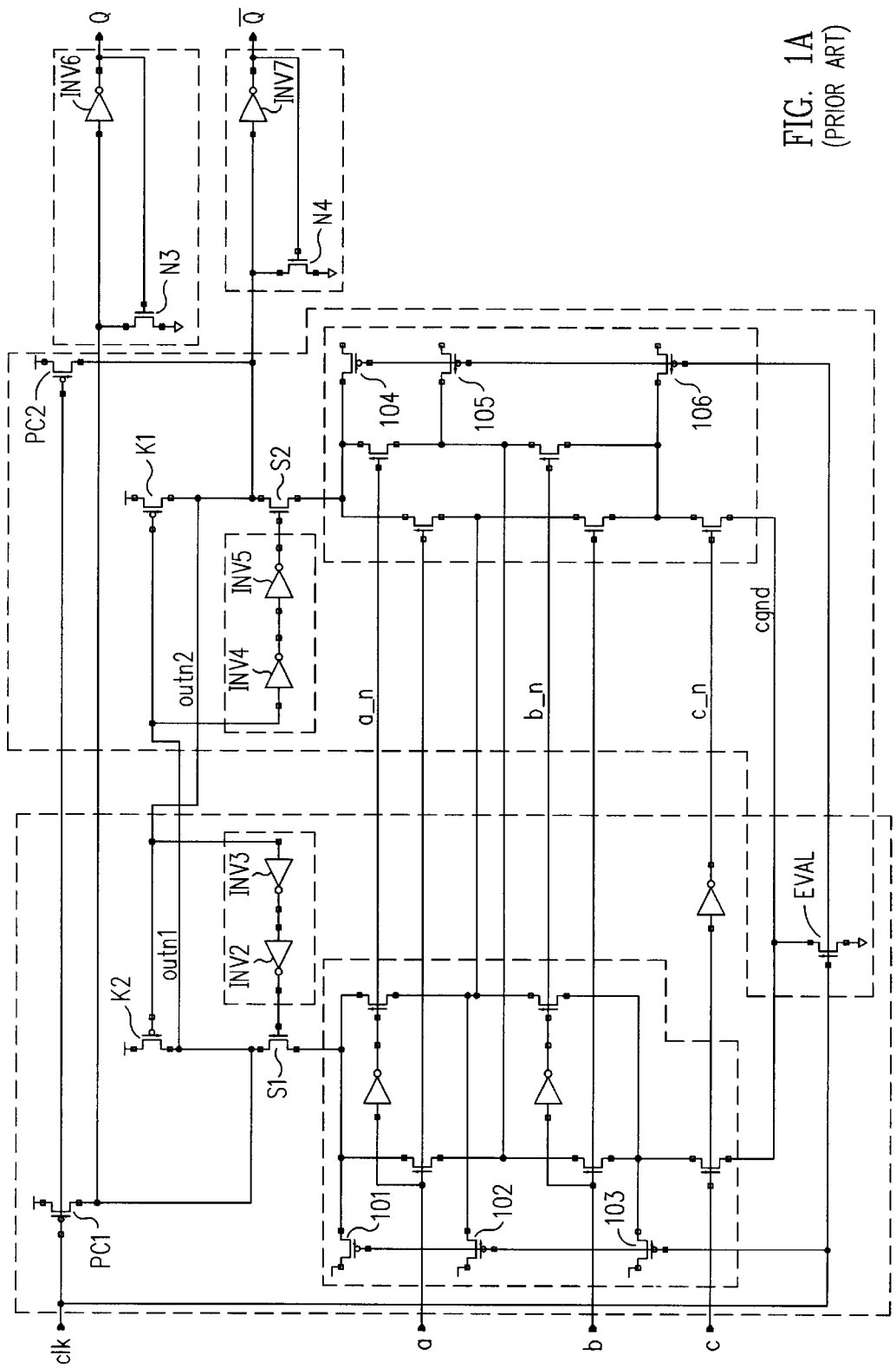
FIG. 1A is a schematic diagram of a prior art dynamic flip-flop that has a charge-sharing problem.
Figure 1B:
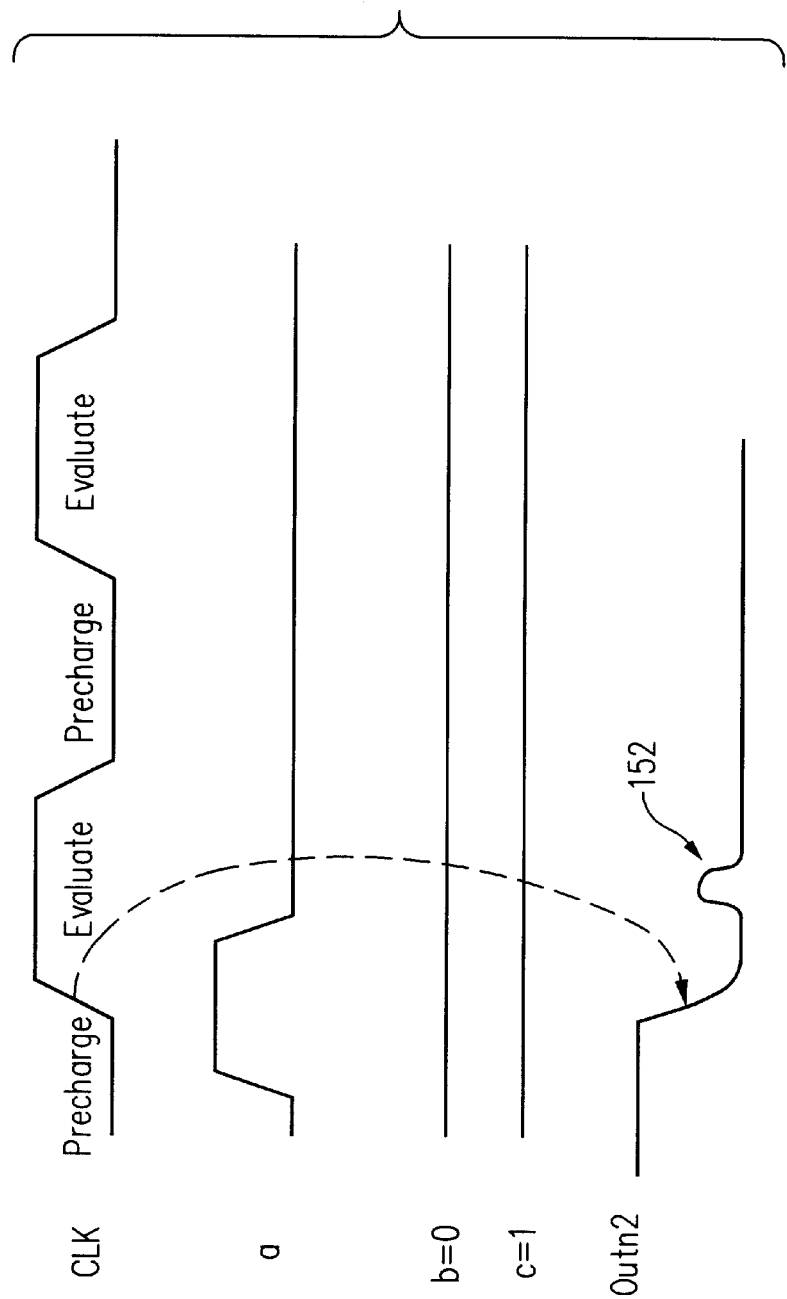
FIG. 1B is a timing diagram for selected signals in the prior art dynamic flip-flop that illustrate the results of the charge-sharing problem.

According to the principles of this invention, a dynamic flip-flop 200 includes a dynamic input stage 201 that has immunity to input signal changes during an evaluation phase and an output stage 202. A single shut-off circuit 210 provides the improved immunity input signal changes. Dynamic flip-flop 200 eliminates the need to determine whether a particular use of the flip-flop results in a charge-sharing problem. Moreover, dynamic flip-flop 200 is easily substituted for any prior-art dynamic flip-flop because the chip area required by dynamic flip-flop is approximately the same as the prior-art dynamic flip-flop described above.

In this embodiment, dynamic input stage 201 includes:

(i) a first input latch 211 with an input terminal D and a clock terminal CLK, and an output terminal that drives a first dynamic input stage output line NOUTN1;

(ii) a second input latch 215 with an input terminal/D and a clock terminal CLK, and an output terminal that drives a second dynamic input stage output line NOUTN2; and (iii) a single shutoff circuit 210 having a first input terminal coupled to output line NOUTN1, a second input terminal coupled to output line NOUTN2, and an output terminal that provides a shut-off signal to input latches 211 and 215 that are substantially identical.

Output line NOUTN1 of input latch 211 provides an output signal to an input lead of a first output latch 221 in output stage 202. An output terminal of latch 221 drives an output terminal Q of dynamic flip-flop 200. Similarly, output line NOUTN2 of input latch 215 provides an output signal to an input lead of a second output latch 223 in output stage 202. An output terminal of latch 223 drives output terminal/Q of dynamic flip-flop 200.

During a logic low portion of each cycle of clock signal CLK, dynamic flip-flop circuit 200 is in a precharge phase. Input latches 211 and 215 precharge the logic signal level on lines NOUTN1 and NOUTN2 to logic high levels. These logic high level signals are inverted by output latches 221 and 223, i.e., latches 221 and 223 are inverting latches. Thus, in the precharge phase, the signals on output terminals Q and/Q are at a logic low level.

In this embodiment, shut-off circuit 210 generates a logic high level output signal when both input signals are at a logic high level, and a logic low level output signal otherwise. Hence, in the precharge phase, shut-off circuit 210 provides a logic high level signal to both input latches 211 and 215. A combination of the logic high level signal from shut-off circuit 210 and a rising clock edge on line CLK is necessary for input latches 211 and 215 to sample the data on terminals D and/D, respectively.

On a rising edge of each cycle of clock signal CLK, dynamic flip-flop 200 enters an evaluation phase. At the beginning of the evaluation phase, input latches 211 and 215 sample data input signal D and a complement of data input signal/D, respectively because the signal from shut-off circuit 210 has not shut-off the sampling capability.

In this embodiment, input latches 211 and 215 each output the complement of the corresponding sampled input signal. Consequently, if data input signal D is at a logic high level, input latch 211 drives a logic low level signal on dynamic input stage output line NOUTN1, and input latch 215 drives a logic high level signal on dynamic input stage output line NOUTN2. In response to these signals on lines NOUTN1 and NOUTN2, output latch 221 generates logic high level signal on output terminal Q. Output latch 223 generates a logic low level output signal on output terminal/Q.

In addition, the logic low level signal on dynamic input stage output line NOUTN1 in combination with the logic high level signal on dynamic input stage output line NOUTN2 causes shut-off circuit 210 to generate a logic low level output signal to input latches 211 and 215. In response to the logic low level output signal, input latch 211 isolates input terminal D and any logic circuitry in latch 211 from line NOUTN1, and input latch 215 isolated input terminal/D and any logic circuitry in latch 215 from output line NOUTN2. Therefore, any changes in the input signal levels are isolated from lines NOUTN1 and NOUTN2 during the remainder of the evaluation phase.

Thus, shutoff circuit 210 operates to prevent both input latches 211 and 215 from sampling the data on input terminals D and/D, respectively after the hold-time of flip-flop 200. One definition for the hold-time is equal to the time from the rising clock edge to the time after the rising clock edge when the signal on line NOUTN2 goes low plus the signal transient delay time of shut-off circuit 210 plus the response time of the latches to the logic low level signal from shut-off circuit 210. Considering the symmetry of dynamic input stage 210, the hold-time is the same when the signal on line NOUTN1 goes low. However, as explained more completely below, a more robust parameter is used to assure proper operation of the dynamic flip-flop of this invention.

Thus, the sampling window of dynamic flip-flop 200 is approximately equal to the time needed by one of input latches 211 and 215 to generate a logic low level output signal plus the signal propagation delay of shut-off circuit 210. Notice that in this invention, both input latches are disabled at the end of the hold-time and not just one of the latches as in the prior art configuration described above.

The relatively short sampling window implements "edge-triggering" because the logic level is, in effect, sampled only at the rising edge of the clock signal CLK. In this embodiment, the logic levels at the output leads of latches 215 and 211 are maintained throughout the remainder of the evaluation phase independent of any charge-sharing in either input latch.

Figure 3:
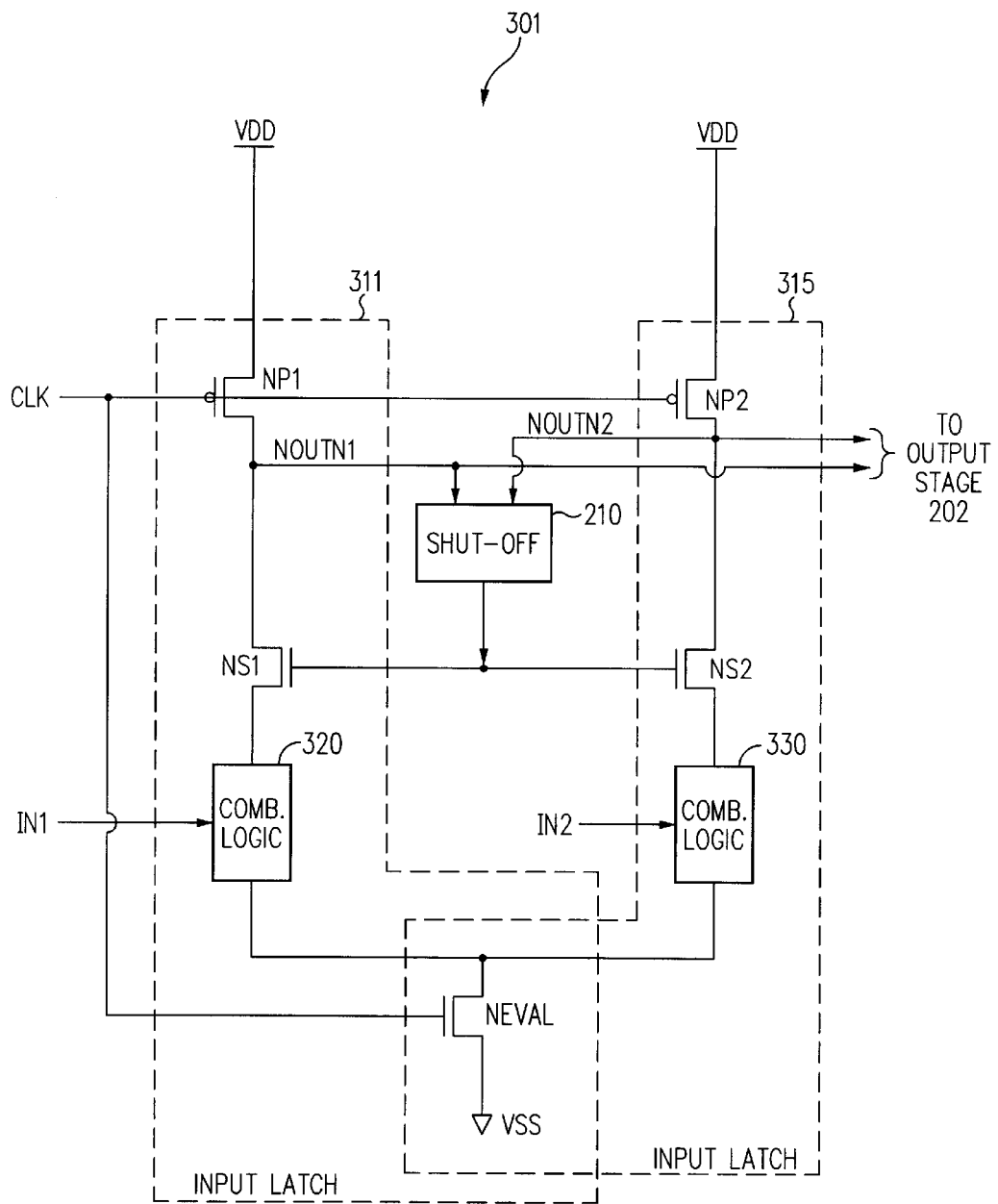
FIG. 3 is a more detailed diagram of another embodiment of the novel dynamic flip-flop of this invention.

FIG. 3 is a more detailed diagram of one embodiment of a dynamic input stage 301 of the dynamic flip-flop of this invention that is particularly advantageous when combinatorial logic is included within the dynamic input stage. As described more completely below, novel shut-off circuit 210 of this invention eliminates the prior art charge-sharing problems.

In this embodiment, a first P-channel metal oxide silicon (MOS) field effect transistor (FET) NP1, sometimes referred to as P-channel transistor NP1, in input latch 311 has a source, e.g., a first lead, connected to a first reference voltage, e.g., supply voltage VDD, and a drain, e.g., a second lead, connected to a first dynamic input stage output line NOUTN1. A gate of P-channel transistor NP1, e.g., a third lead, is driven by clock signal CLK.

Similarly, a P-channel MOSFET NP2, sometimes referred to as P-channel transistor NP2, in input latch 315 has a source, e.g., a first lead, connected to the first reference voltage, e.g., supply voltage VDD, and a drain, e.g., a second lead, connected to a second dynamic input stage output line NOUTN2. A gate of P-channel transistor NP2, e.g., a third lead, is driven by clock signal CLK. Those of skill in the art will appreciate that with a change in biasing, the source and drain designations of a MOSFET can be reversed. Therefore, the configuration shown in FIG. 3 is illustrative only, and is not intended to limit the invention to the specific configuration illustrated.

Dynamic-input-stage output line NOUTN1 also is connected to a drain, e.g., a first lead, of a first N-channel shut-off MOSFET NS1, sometimes referred to as N-channel shut-off transistor NS1, that has a source, a second lead, connected to a first terminal of combinatorial logic circuit 320. A gate of N-channel shut-off transistor NS1 is connected to the output terminal of shut-off circuit 210.

Dynamic-input-stage output line NOUTN2 also is connected to a drain, e.g., a first lead, of a second N-channel shut-off MOSFET NS2, sometimes referred to as N-channel shut-off transistor NS2, that has a source, a second lead, connected to a first terminal of combinatorial logic circuit 330. A gate of N-channel shut-off transistor NS2 also is connected to the output terminal of shut-off circuit 210.

A first set of input signals to the dynamic flip-flop is connected to lines IN1 that in turn provide a set of input signals to combinatorial logic circuit 320. A second set of input signals to the dynamic flip-flop is connected to lines IN2 that in turn provide a set of input signals to combinatorial logic circuit 330. Typically, each signal in the second set of signals is a complement of one of the signals in the first set of signals, and the output signal of combinatorial logic circuit 320 is the complement of the output signal of combinatorial logic circuit 330. As is known to those of skill in the art, dynamic logic is positive logic. The inclusion of combinatorial logic circuits 320 and 330 in flip-flop 300 permits implementation of both positive and negative logic functions in dynamic logic.

A second terminal of combinatorial logic circuit 320 and a second terminal of combinatorial logic circuit 330 are connected to a drain, e.g., a first lead, of an N-channel MOSFET NEVAL, sometimes referred to as N-channel transistor NEVAL or N-channel evaluation transistor NEVAL. A gate of N-channel transistor NEVAL is connected to terminal CLK of the dynamic flip-flop. A source, e.g., a second lead, of N-channel transistor NEVAL is connected to a second reference voltage, e.g., power supply voltage VSS.

In the precharge phase, clock signal CLK is a logic low level signal. Consequently, P-channel transistors NP1 and NP2 conduct, and N-channel transistor NEVAL is turned off. Thus, as described above, in the precharge phase, the signal levels on dynamic input stage output lines NOUTN1 and NOUTN2 are pulled-up to the logic high level.

The logic high level signals on lines NOUTN1 and NOUTN2 are input signals to shut-off circuit 210. Table 1 is one embodiment of a truth table for the operation of shut-off circuit 210.

TABLE 1

| Logic Level of Input Signal on Line NOUTN1 | Logic Level of Input Signal on Line NOUTN2 | Logic Level of Shut-off Circuit Output Signal |
| --- | --- | --- |
| 1 | 1 | 1 |
| 0 | X | 0 |
| X | 0 | 0 |

X = Don't Care

Hence, in the precharge phase, shut-off circuit 210 generates a logic high level signal on the gates of N-channel shut-off transistors NS1 and NS2, both of which conduct.

As clock signal CLK transition from a logic low level to a logic high level, i.e., the dynamic flip-flop transitions from the precharge phase to the evaluation phase, N-channel transistor NEVAL starts to conduct, and P-channel transistors NP1 and NP2 are shut-off. Therefore, combinatorial logic circuits 320 and 330 determine the output signals on lines NOUTN1 and NOUTN2, respectively.

Assume that combinatorial logic circuit 330 forms a conductive path between the source of shut-off N-channel transistor NS2 and the drain of N-channel transistor NEVAL. Since this establishes a conductive path between line NOUTN2 and the second reference voltage, line NOUTN2 is at the second reference voltage, which in this example is a logic low level signal.

When combinatorial logic circuit 330 forms a conductive path to the second reference voltage, combinatorial logic circuit 320 does not form a conductive path to the second reference voltage. Consequently, the signal level on line NOUTN1 remains at the logic high level in the evaluation phase. Thus, in the evaluation phase for this example, the input signal to shut-off circuit 210 from line NOUTN2 is a logic low level signal.

Consequently, shut-off circuit 210 generates a logic low level signal on the gates of N-channel shut-off transistors NS1 and NS2 which turns transistors NS1 and NS2 off for the remainder of the evaluation phase. In view of the symmetry of dynamic input stage 301, shut-off circuit 210 works in an identical fashion when combinatorial circuit 320 causes the logic level on line NOUTN1 to be pulled down to a logic low level.

In this embodiment, one definition of the hold time of the dynamic flip-flop with dynamic input stage 301 is the time required to pull the signal level down on one of lines NOUTN1 and NOUTN2 plus the signal transient time to the gates of N-channel shut-off transistors NS1 and NS2 plus the time required for N-channel shut-off transistors NS1 and NS2 to go from the on-state to the off-state. In one embodiment, shut-off circuit 210 includes a plurality of time delay taps so that the hold time can be programmably selected for conditions in a particular part of a circuit by selecting a signal from one of the taps to drive the gates of N-channel shut-off transistors NS1 and NS2.

According to the principles of this invention, after the hold-time, combinatorial logic circuits 320 and 330 are both isolated from the corresponding dynamic input stage output line. Therefore, the two output signals of the dynamic flip-flop of this invention are immune from any activity that occurs in either of combinatorial logic circuits 320 and 330 during the remainder of the evaluation phase irrespective of the cause of such activity. This provides a significant improvement over the prior art dynamic flip-flop because it eliminates the need to either analyze or compensate for charge-sharing effects that can occur in the dynamic input stage during the evaluation phase.

Figure 4:
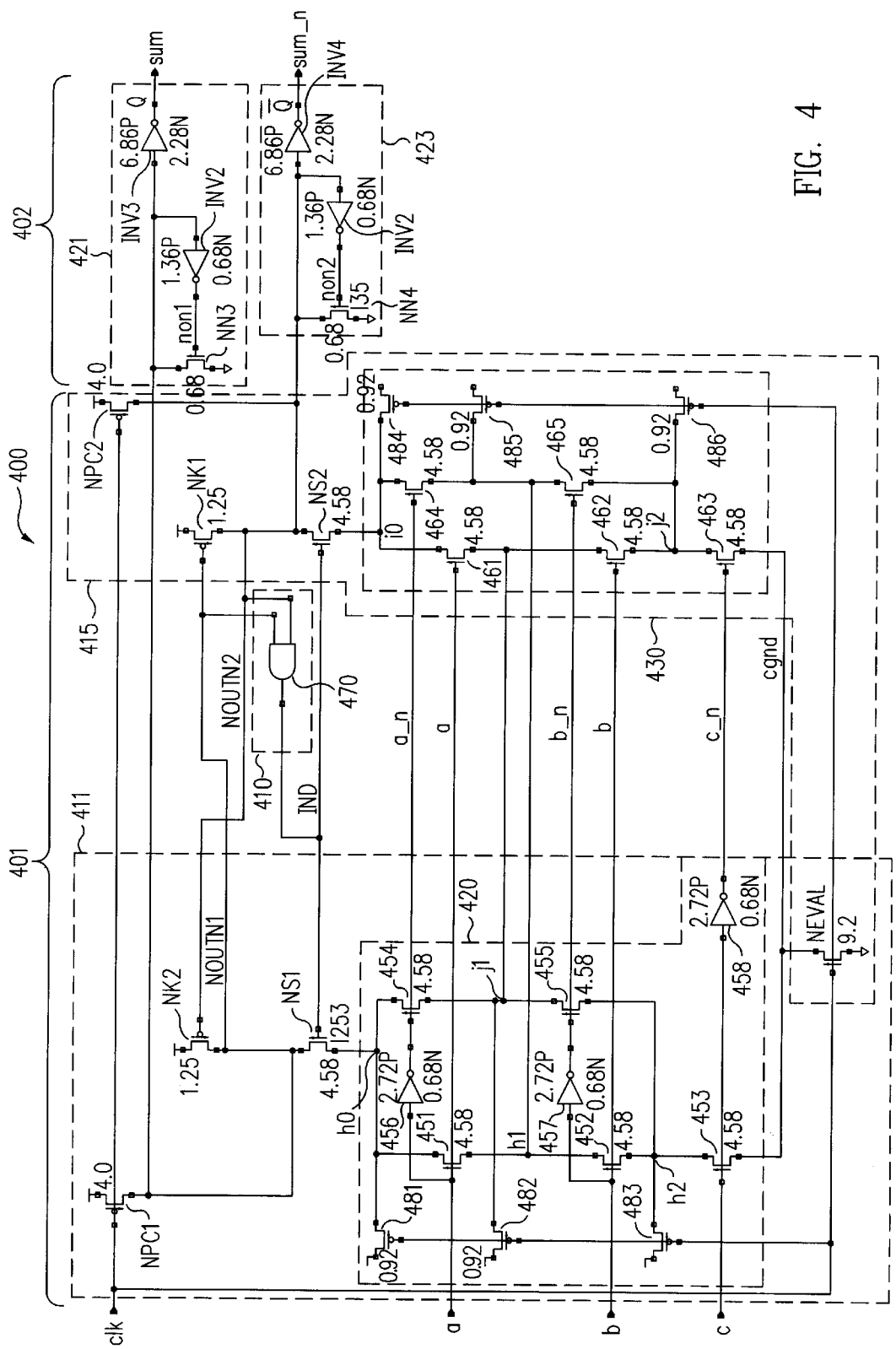
FIG. 4 is a detailed schematic diagram of a dynamic flip-flop according to the principles of this invention.

FIG. 4 is a more detailed schematic of a dynamic flip-flop 400 that utilizes an embodiment of dynamic input stage 301, i.e., dynamic input stage 401, that includes a three input Exclusive OR (XOR) gate and a three input Exclusive NOR gate in combinatorial logic circuits 420 and 430.

Input latch 411 includes P-channel transistors NPC1 and NK2 (herein, a P-channel transistor is a P-channel MOSFET), and N-channel transistors NS1 and NEVAL (herein an N-channel transistor is an N-channel MOSFET). P-channel transistor NPC1 has a gate coupled to receive clock signal CLK; a source coupled to voltage VDD, i.e., the rail of power supply voltage VDD, and a drain connected to dynamic input stage output node NOUTN1. P-channel transistor NK2 has a gate coupled to receive the output signal on dynamic input stage output node NOUTN2; a source coupled to voltage VDD, i.e., the rail of power supply voltage VDD, and a drain connected to dynamic input stage output node NOUTN1.

Dynamic input stage output node NOUTN1 also is connected to a drain of the N-channel shut-off transistor NS1. A gate of N-channel shut-off transistor NS1 is coupled to both output node NOUTN1 and output node NOUTN2 by shut-off circuit 410 that in this embodiment is an AND gate 470. A source of N-channel shut-off transistor NS1 is connected to an output node h0 of combinatorial logic circuit 420.

In this embodiment, combinatorial logic circuits 420 and 430 implement an Exclusive OR gate with three input signals and a complement of each of the three input signals. For input signals A, B, and C, output signal h0 at node h0 is:

$$h0 = (/A*/B*/C) + (/A*B*C) + (A*/B*C) + (A*B*/C)$$

Output signal /h0 at node i0 is $$/h0 = (A*B*C) + (A*/B*/C) + (/A*/B*C) + (/A*B*/C)$$

where /is a logical negation, and so /A is the logical negation of signal A.

In this embodiment, combinatorial logic circuit 420 includes five identical N-channel MOSFETs 451 to 455. N-channel transistors 451 to 453 are connected in series source-to-drain, with a drain of N-channel transistor 451 connected to output node h0 and a source of transistor 453 connected to a drain of N-channel evaluation transistor NEVAL. N-channel transistors 454 and 455 are connected in series source-to-drain, with a drain of N-channel transistor 454 connected to output node h0 and a source of transistor 455 connected to a drain of N-channel evaluation transistor NEVAL.

First input line A is connected to a gate of N-channel transistor 451 and to an input terminal of inverter 456. Second input line B is connected to a gate of N-channel transistor 452 and to an input terminal of inverter 457. Third input line C is connected to a gate of N-channel transistor 453 and to an input terminal of inverter 458.

An output terminal of inverter 456 is connected to a gate of N-channel transistor 454 and to a gate of N-channel transistor 464. An output terminal of inverter 457 is connected to a gate of N-channel transistor 455 and to a gate of N-channel transistor 465. An output terminal of inverter 458 is connected to a gate of N-channel transistor 463.

Three precharge transistors, P-channel transistors 481 to 483, also are included in combinatorial logic circuit 420. A source of P-channel transistor 481 is connected to voltage VDD, and a drain of P-channel transistor 481 is connected to node h0. A source of P-channel transistor 482 also is connected to voltage VDD, and a drain of P-channel transistor 482 is connected to the source of N-channel transistor 454 and to a source of N-channel transistor 461. A source of P-channel transistor 463 also is connected to voltage VDD, and a drain of P-channel transistor 463 is connected to the source of N-channel transistor 452. The gates of P-channel transistors 481 to 483 are connected to terminal CLK of dynamic flip-flop 400.

N-channel transistor NEVAL has a gate connected to clock terminal CLK and a source coupled to the second reference voltage, i.e., the rail of power supply voltage VSS.

Input latch 415 includes P-channel transistors NPC2 and NK1, and N-channel transistors NS2 and NEVAL. P-channel transistor NPC2 has a gate coupled to receive clock signal CLK; a source coupled to voltage VDD, i.e., the rail of power supply voltage VDD, and a drain connected to dynamic input stage output node NOUTN2. P-channel transistor NK1 has a gate coupled to receive the output signal on dynamic input stage output node NOUTN1; a source coupled to voltage VDD, i.e., the rail of power supply voltage VDD, and a drain connected to dynamic input stage output node NOUTN2.

Dynamic input stage output node NOUTN2 also is connected to a drain of N-channel shut-off transistor NS2. A gate of N-channel shut-off transistor NS2 is coupled to both output node NOUTN1 and output node NOUTN2 by AND gate 470. A source of N-channel shut-off transistor NS2 is connected to an output node i0 of combinatorial logic circuit 430.

In this embodiment, combinatorial logic circuit 430 also includes five identical N-channel MOSFETs 461 to 465. N-channel transistors 461 to 463 are connected in series source-to-drain, with a drain of N-channel transistor 461 connected to output node i0 and a source of transistor 463 connected to a drain of N-channel evaluation transistor NEVAL. N-channel transistors 464 to 465 are connected in series source-to-drain, with a drain of N-channel transistor 464 connected to output node i0 and a source of transistor 465 connected to a drain of N-channel evaluation transistor NEVAL.

First input line A is connected to a gate of N-channel transistor 461. Second input line B is connected to a gate of N-channel transistor 462. The lines connected to the gates of N-channel transistors 463 to 465 were described above.

Three precharge transistors, P-channel transistors 484 to 486, also are included in combinatorial logic circuit 430. A source of P-channel transistor 484 is connected to voltage VDD, and a drain of P-channel transistor 484 is connected to node i0. A source of P-channel transistor 485 also is connected to voltage VDD, and a drain of P-channel transistor 485 is connected to the source of N-channel transistor 464 and to the source of N-channel transistor 451. A source of P-channel transistor 486 also is connected to voltage VDD, and a drain of P-channel transistor 486 is connected to the source of N-channel transistor 465 and to the source of N-channel transistor 462. The gates of P-channel transistors 484 to 486 are connected to terminal CLK of dynamic flip-flop 400.

Output latch 421 includes inverters INV1 and INV3 and an N-channel transistor NN3. An input lead of inverter INV1 and an input lead of inverter INV3 are connected to output node NOUTN1. An output lead of inverter INV1 is connected to a gate of the N-channel transistor NN3. N-channel transistor NN3 has a source connected to voltage source VSS, and a drain connected to the input lead of inverter INV3. An output terminal of INV3 is output terminal Q of dynamic flip-flop circuit 400.

Output latch 423 includes inverters INV2 and INV4 and an N-channel transistor NN4. An input lead of inverter INV2 and an input lead of inverter INV4 are connected to output node NOUTN2. An output lead of inverter INV2 is connected to a gate of N-channel transistor NN4. N-channel transistor NN4 has a source connected to voltage source VSS, and a drain connected to the input lead of the inverter INV4. An output terminal of INV4 is output terminal/Q of dynamic flip-flop circuit 400.

Precharge Phase

Figure 5:
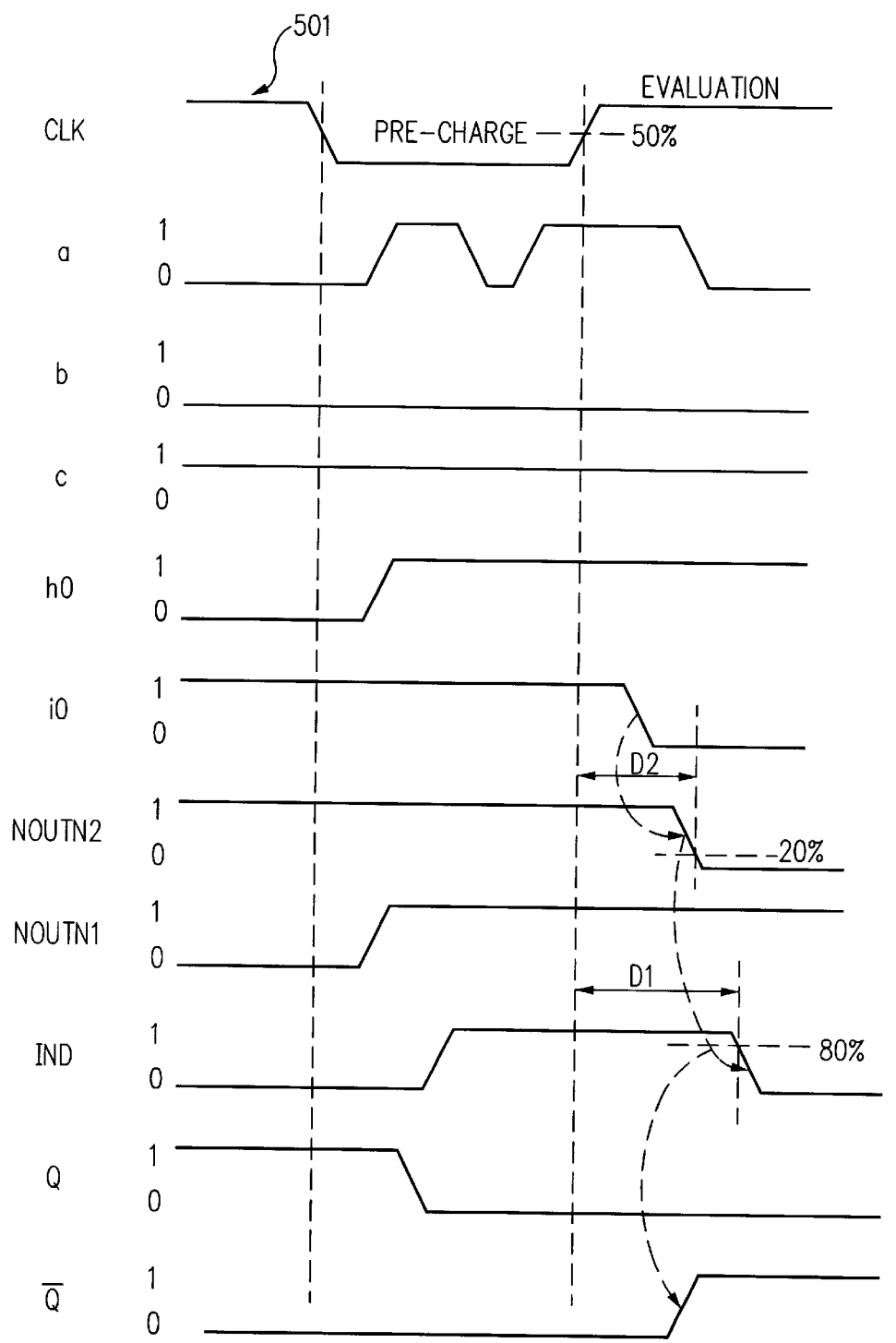
FIG. 5 is a timing diagram for the dynamic flip-flop of FIG. 4.

A timing diagram that illustrates the operation of dynamic flip-flop circuit 400 with an embedded three input XOR is presented in FIG. 5. When clock signal CLK is at a logic low level, dynamic flip-flop circuit 400 is in the precharge phase, as indicated by clock waveform 501. Consequently, the precharge devices, i.e., P-channel transistors NPC1, NPC2, are turned on and N-channel transistor NEVAL is turned off. Precharge devices, i.e., P-channel transistors 481, 482, 483, 484, 485 and 486 also are turned on. Since N-channel transistor NEVAL is off, there is no path to voltage VSS. Consequently, P-channel transistors NPC1 and NPC2 pull up the voltage at output nodes NOUTN1 and NOUTN2 to approximately rail voltage VDD, thereby precharging output nodes NOUTN1 and NOUTN2.

The logic high level signals on output nodes NOUTN1 and NOUTN2 are applied to keeper devices, i.e., to the gates of P-channel transistors NK1 and NK2, respectively. Thus, P-channel transistors NK1 and NK2 are turned off in the pre-charge phase.

The logic high level signals at output nodes NOUTN1 and NOUTN2 also are input signals to AND gate 470. Thus, in the precharge phase, AND gate 470 generates a logic high level signal on node IND that is connected to an output terminal of AND gate 470 and to the gates of N-channel shutoff transistors NS1 and NS2. Thus, the logic high level signal on node IND is applied to the shutoff devices, i.e., to the gates of N-channel shut-off transistors NS1 and NS2. In the precharge phase, shut-off transistors NS1 and NS2 are turned on after the signal propagation delay introduced by AND gate 470.

In the precharge phase, P-channel transistors 481 to 486 pull up nodes h0, h1, h2, i0, j1, and j2 to a logic high level. The logic high level signals at output nodes NOUTN1 and NOUTN2 respectively propagate through inverters INV3 and INV4, causing output signals Q and/Q to be at a logic low level during the precharge phase. The logic high level signals at output nodes NOUTN1 and NOUTN2 are applied to inverters INV1 and INV2, respectively, which in turn drive the gates of N-channel transistors NN3 and NN4, respectively. Thus, the logic low output signals from inverters INV1 and INV2 during the precharge phase turn off N-channel transistors NN3 and NN4.

Evaluation Phase

When clock signal CLK transitions to a logic high level, i.e., low-to-high, N-channel transistor NEVAL is turned on, which places dynamic flip-flop circuit 400 in the evaluation phase. N-channel transistor NEVAL pulls down the voltage at common ground node CGND to approximately rail voltage VSS. In addition, the low-to-high transition of clock signal CLK turns off precharge devices NPC1 and NPC2, as well as P-channel transistors 481 to 486.

Data input signals A, B, and C are applied to combinatorial logic circuit 420 and complementary data signals A_N, B_N, and C_N, respectively, are applied to combinatorial logic circuit 430. In this example, data input signals A and C are at a logic high level while data input signal B is at a logic low level. Each of these signals must be stable immediately prior to the low-to-high transition of signal CLK that starts the evaluation phase, and remain stable for the hold-time of dynamic flip-flop 400. Data input signals A, B, and C need not be stable except at around the beginning of the evaluation phase.

In this embodiment, the performance of dynamic flip-flop is determined not by the set-up and hold times, but rather a time D1 from when clock signal CLK reaches fifty percent of its maximum value until the signal on node IND falls to eighty percent of its original value. (See FIG. 5) A clock to Q time parameter D2 is defined as the time from when clock signal CLK reaches fifty percent of its maximum value until the signal on the output node of dynamic input stage 401 that goes from high-to-low reaches twenty percent of its original value. (See FIG. 5) A margin M is defined as:

$$M=((D1-D2)/(D1+D2))*100$$

In one embodiment, flip-flop 400 is designed so that margin M is greater than 10 percent.

For the combination of signals illustrated in FIG. 5, N-channel transistors 451, 453, and 455 are turned on, while N-channel transistors 452 and 454 are turned off in combinatorial logic circuit 420. Thus, there is no conductive path from node h0 to node CGND. Consequently, node h0 remains at approximately rail voltage VDD. Although shut-off N-channel transistor NS1 is turned on at the start of the evaluation phase, the logic level on node NOUTN1 remains at approximately rail voltage VDD also.

In combinatorial logic circuit 430, N-channel transistors 461 and 465 are turned on, while N-channel transistors 462 to 464 are turned off. Thus, there is a conductive path from node i0 to node CGND through transistors 461, 455, and 453. Consequently, node i0 is pulled down to approximately rail voltage VSS. Since N-channel transistor NS2 is turned on at the start of the evaluation phase, the logic level on node NOUTN2 is pulled down to approximately rail voltage VSS also.

Thus, in this example, input latch 411 generates a logic high output signal at output node NOUTN1, which turns off keeper P-channel transistor NK1 to help keep the voltage at output node NOUTN2 at a logic low. The logic high level at output node NOUTN1 also propagates through inverter INV3. As a result, output signal Q remains low.

The logic high level signal at output node NOUTN1 also drives inverter INV1. Consequently, inverter INV1 generates a logic low level output signal that keeps N-channel transistor NN3 shut-off, which helps to maintain the logic high level signal at output node NOUTN1. The logic high level at output node NOUTN1 does not affect the output signal of AND gate 470.

In this example, input latch 415 generates a logic low output signal at output node NOUTN2, which turns on keeper P-channel transistor NK2 to help keep the voltage at output node NOUTN1 at a logic high level. The logic low level at output node NOUTN2 also propagates through inverter INV4. As a result, output signal/Q transitions from a logic low level to a logic high level.

The logic low level signal at output node NOUTN2 also drives inverter INV2. Consequently, inverter INV2 generates a logic high level output signal that turns on N-channel transistor NN4, which helps to maintain the logic low level signal at output node NOUTN2.

The logic low level at output node NOUTN2 causes the output signal of AND gate 470 to be driven low. The logic low level signal from AND gate 470 drives the gate voltages of the N-channel transistors NS1 and NS2 to a logic low level. Consequently, shutoff devices NS1 and NS2 are turned off. As a result, input latch 415 is disabled from sampling the voltage at node i0 of combinatorial logic circuit 430, and input latch 411 is simultaneously disabled from sampling the voltage at node h0 of combinatorial logic circuit 420.

Since N-channel transistor NS1 is off, combinatorial logic circuit 420 cannot discharge output node NOUTN1 even if data input signals a, b, c, were to cause the voltage at node h0 to subsequently transition to a logic low level during this evaluation phase. Thus, output signal Q remains at a logic low level.

Similarly, since N-channel transistor NS2 is off, combinatorial logic circuit 430 cannot affect the output signal on output node NOUTN2 even if data input signals a, b, c, were to cause the voltage at node i0 to subsequently transition to a logic high level during this evaluation phase. Thus, output signal/Q remains at a logic high level until the start of the next precharge phase.

While the timing diagram in FIG. 5 is for a particular set of input signals, in view of the above disclosure those of skill in the art can determine the operation of dynamic flip-flop for any combination of input signals. The symmetry of the input latches and the output latches means that both input latches and output latches function in a substantially identical fashion. Therefore, the above description is not repeated for a combination of input signals that pulls the signal level on node h0 low.

The two stage design of the dynamic flip-flop circuit 400 with the novel shut-off circuit prevents problems associated with charge-sharing during the evaluation phase. The enhanced shut-off operation improves the immunity to input signal changes during the evaluation phase across supply voltage, temperature, and process variations.

Figure 2:
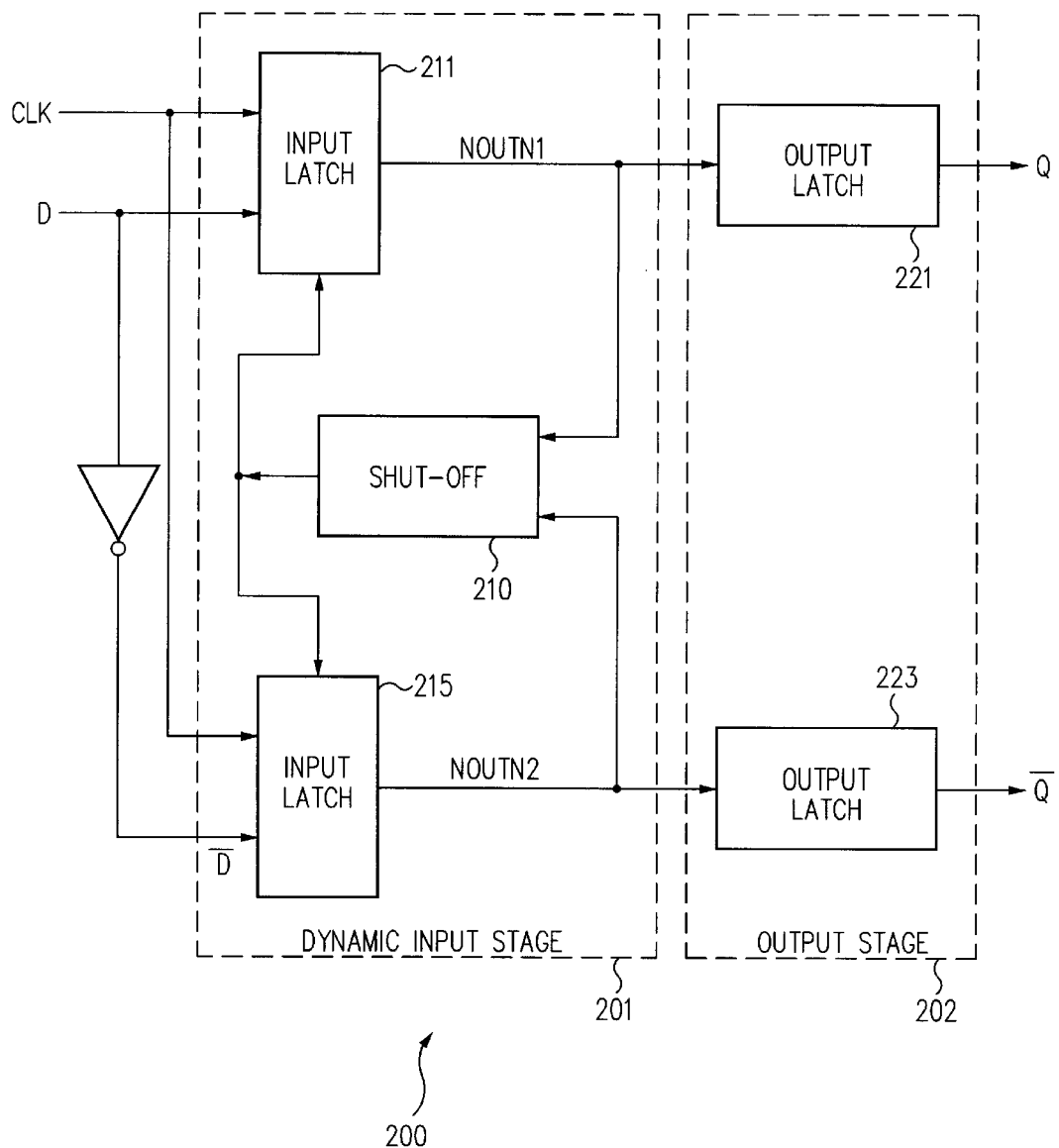
FIG. 2 is a block diagram of a novel dynamic flip-flop according to the principles of this invention.

The embodiments of the dynamic flip-flop described above are illustrative of the principles of this invention and are not intended to limit the invention to the particular embodiments described. For example, those skilled in the art of flip-flops can implement an NMOS (or other transistor technology) embodiment in view of this disclosure without undue experimentation. Those skilled in the art of flip-flops can also implement a "complementary" embodiment, in which the dynamic flip-flop circuit has "series" P-channel devices and N-channel "hold" devices. In addition, if the dynamic flip-flop is used as part of a scan chain, corresponding changes could be made to implement the scan capability. In this case, the shut-off circuit may include one or more logic gates. Nevertheless, the important aspect is that the output signal from the shut-off circuit is applied to both input latches as illustrated in FIGS. 2 and 3.

We claim:

1. A dynamic flip-flop having first and second phases of operation, said dynamic flip-flop comprising:
   a first input latch having at least one input line, a clock line, and an output line,
   wherein said first input latch generates a signal on said output line of said first input latch having a predefined logic state during said first phase of operation; and
   said first input latch generates a signal on said output line of said first input latch in response to an input signal on said at least one input line of said first input latch upon initiation of said second phase of operation;
   a second input latch having at least one input line, a clock line, and an output line,
   wherein said second input latch generates a signal on said output line of the second input latch having said predefined logic state during said first phase of operation; and
   said second input latch generates a signal on said output line of said second input latch in response to an input signal on said at least one input line of said second input latch upon initiation of said second phase of operation; and a shut-off circuit comprising:
   a first input line coupled to said output line of said first input latch;
   a second input line coupled to said output line of said second input latch; and
   an output line coupled to said first input latch and to said second input latch,
   wherein said shut-off circuit generates a signal on said output line, in response to a change of signal level on one of said first and second input lines following said initiation of said second phase of operation, that decouples said input line of said first input latch from said output line of said first input latch and also that decouples said input line of said second input latch from said output line of said second input latch for a remainder of said second phase of operation and so terminates sampling of signals on both said at least one input line of said first input latch and said at least one input line of said second input latch during said second phase of operation.

2. The dynamic flip-flop of claim 1 further comprising:
   an output stage having a first output line coupled to said output line of said first input latch, and a second output line coupled to said output line of said second input latch.

3. The dynamic flip-flop of claim 1 wherein said at least one input line of said first input latch is an input line to a combinatorial logic circuit.

4. The dynamic flip-flop of claim 1 wherein said at least one input line of said second input latch is an input line to a combinatorial logic circuit.

5. The dynamic flip-flop of claim 3 wherein said at least one input line of said second input latch is an input line to another combinatorial logic circuit.

6. The dynamic flip-flop of claim 5 wherein said combinatorial logic circuit and said another combinatorial logic circuit comprise an Exclusive OR gate circuit and an Exclusive NOR gate circuit.

7. The dynamic flip-flop of claim 1 wherein said shut-off circuit comprises a logic gate.

8. The dynamic flip-flop of claim 7 wherein said logic gate comprises a logic AND gate.

9. A dynamic flip-flop having first and second phases of operation, said dynamic flip-flop comprising:
   a first input latch comprising:
     a first combinatorial logic circuit having a plurality of input lines, and an output terminal;
     a first transistor having a first channel type; a first lead connected to said output terminal of said first combinatorial logic circuit; a second lead; and a gate;
     a second transistor having a second channel type; a first lead connected to said second lead of said first transistor; a second lead connected to a first reference voltage; and a gate connected to a clock terminal; and
     an output line connected to said second lead of said first transistor;
   a second input latch comprising:
     a second combinatorial logic circuit having a plurality of input lines, and an output terminal;
     a third transistor having said first channel type; a first lead connected to said output terminal of said second combinatorial logic circuit; a second lead; and a gate;
     a fourth transistor having said second channel type; a first lead connected to said second lead of said third transistor, a second lead connected to said first reference voltage, and a gate connected to said clock terminal; and
     an output line connected to said second lead of said third transistor; and
   a shut-off circuit having a first input terminal connected to said output line of said first latch; a second input terminal connected to said output line of said second latch; and an output line connected to said gate of said first transistor, and connected to said gate of said third transistor.

10. The dynamic flip-flop of claim 9 wherein said first and second input latches further comprise:
   a fifth transistor having said first channel type; a first lead connected to another terminal of said first combinatorial logic circuit and to another terminal of said second combinatorial logic circuit; a second lead connected to a second reference voltage, and a gate connected to said clock terminal.

11. The dynamic flip-flop of claim 9 wherein said first and second combinatorial logic circuits comprise an Exclusive OR gate circuit and an Exclusive NOR gate circuit.

12. The dynamic flip-flop of claim 9 further comprising:
   an output stage having a first output line coupled to said output line of said first input latch, and a second output line coupled to said output line of said second input latch.

13. The dynamic flip-flop of claim 9 wherein said shut-off circuit comprises a logic gate.

14. The dynamic flip-flop of claim 13 wherein said logic gate comprises a logic AND gate.

15. The dynamic flip-flop of claim 9 where said first channel type is an N-channel.

16. The dynamic flip-flop of claim 1 wherein said first phase of operation is a precharge phase of operation of the dynamic flip flop.

17. The dynamic flip-flop of claim 1 wherein said second phase of operation is an evaluation phase of operation of the dynamic flip flop.

* * * * *